US007989338B2

(12) United States Patent
Zhang et al.

(10) Patent No.: US 7,989,338 B2
(45) Date of Patent: Aug. 2, 2011

(54) GRAIN BOUNDARY BLOCKING FOR STRESS MIGRATION AND ELECTROMIGRATION IMPROVEMENT IN CU INTERCONNECTS

(75) Inventors: Fan Zhang, Singapore (SG); Kho Liep Chok, Cupertino, CA (US); Alex See, Singapore (SG); Cheng-Cheh Tan, Singapore (SG); Xiaomei Bu, Singapore (SG); Tae Jong Lee, Singapore (SG); Liang Choo Hsia, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 780 days.

(21) Appl. No.: 11/153,747

(22) Filed: Jun. 15, 2005

(65) Prior Publication Data

US 2006/0286797 A1 Dec. 21, 2006

(51) Int. Cl.
*H01L 21/4763* (2006.01)

(52) U.S. Cl. ........................................................ 438/622

(58) Field of Classification Search ........................ None
See application file for complete search history.

(56) References Cited

U.S. PATENT DOCUMENTS 6,022,808 A * 2/2000 Nogami et al. ............... 438/694
6,023,100 A * 2/2000 Tao et al. ...................... 257/762
6,117,770 A 9/2000 Pramanick et al.
6,228,759 B1 5/2001 Wang et al.
6,268,291 B1 * 7/2001 Andricacos et al. .......... 438/694
6,426,289 B1 7/2002 Farrar
6,440,849 B1 * 8/2002 Merchant et al. ............. 438/658
6,500,749 B1 12/2002 Liu et al.
6,589,874 B2 * 7/2003 Andricacos et al. .......... 438/694
6,633,085 B1 10/2003 Besser et al.
6,713,875 B2 3/2004 Farrar
6,717,236 B1 * 4/2004 Lopatin et al. ................ 257/586
7,115,498 B1 * 10/2006 Adem ........................... 438/627
7,169,700 B2 * 1/2007 Chang et al. .................. 438/637
7,183,629 B2 * 2/2007 Engelmann et al. .......... 257/627
2002/0115292 A1 * 8/2002 Andricacos et al. .......... 438/687
2003/0015793 A1 * 1/2003 Merchant et al. ............. 257/734
2003/0160330 A1 8/2003 McTeer
2004/0005773 A1 1/2004 Lopatin et al.
2005/0046031 A1 * 3/2005 Engelmann et al. .......... 257/767
2006/0027460 A1 * 2/2006 Chang et al. .................. 205/104
2006/0286797 A1 * 12/2006 Zhang et al. .................. 438/659

OTHER PUBLICATIONS

Ensinger, W.; Modification of mechanical and chemical surface properties of metals by plasma immersion ion implantation; Surface and Coatings Technology; 1998; pp. 341-352; continued . . . 100-101; Elsevier Sciences B.V.; 12 pages.
Ogawa et al.; Stress-Induced Voiding Under Vias Connected to Wide Cu Metal Leads; Pub. date unknown—received by rep May 16, 2004; 10 pages.
Kumar et al.; Semiconductor applications of plasma immersion ion implantation technology; Bull. Mater. Sci.; Nov. 2002; pp. 549 to 551; vol. 25, No. 6; 3 pages.

* cited by examiner

*Primary Examiner* — David E Graybill
(74) *Attorney, Agent, or Firm* — Horizon IP Pte Ltd

(57) ABSTRACT

Example embodiments of a structure and method for forming a copper interconnect having a doped region near a top surface. The doped region has implanted alloying elements that block grain boundaries and reduce stress and electro migration. In a first example embodiment, the barrier layer is left over the inter metal dielectric layer during the alloying element implant. The barrier layer is later removed with a planarization process. In a second example embodiment the barrier layer is removed before the alloying element implant and a hard mask blocks the alloying element from being implanted in the inter metal dielectric layer.

22 Claims, 6 Drawing Sheets

GRAIN BOUNDARY BLOCKING FOR STRESS MIGRATION AND ELECTROMIGRATION IMPROVEMENT IN CU INTERCONNECTS

BACKGROUND OF INVENTION

1) Field of the Invention

This invention relates generally to the field of semiconductor processing, and more particularly, to reduction of electromigration and stress voids in metal interconnect structures.

2) Description of the Prior Art

The ever increasing requirements for high density and performance associated with ultra large scale integration (ULSI) semiconductor device wiring are difficult to satisfy in terms of providing submicron-sized, low resistance-capacitance (RC) metallization patterns. Conventional semiconductor devices typically comprise a semiconductor substrate, usually a doped monocrystalline silicon (Si), and plurality of sequentially formed interlayer dielectrics and electrically conductive patterns. An integrated circuit is formed therefrom containing a plurality of patterns of conductive lines separated by inter-wiring spacings. Typically, the conductive patterns of vertically spaced metallization layers are electrically connected by vertically oriented conductive plugs filling via holes formed in the interlayer dielectric layer separating the metallization layers, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and micro-miniaturization requirements.

A commonly employed method for forming conductive plugs for electrically interconnecting vertically spaced metallization layers is known as "damascene"—type processing. Generally, this processing involves forming an opening (or via) in the dielectric interlayer, which will subsequently separate the vertically spaced metallization layers. The opening is typically formed using conventional lithographic and etching techniques. After the opening is formed, the opening is filled with conductive material, such as tungsten or copper, using conventional techniques. Excess conductive material on the surface of the dielectric interlayer is then typically removed by chemical mechanical planarization (CMP).

High performance microprocessor applications require rapid speed of semiconductor circuitry, and the integrated circuit speed varies inversely with resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

Copper (Cu) and Cu-based alloys are particularly attractive for use in VLSI and ULSI semiconductor devices, which require multi-level metallization layers. Copper and copper-based alloy metallization systems have very low resistivities, which are significantly lower than tungsten and even lower than those of previously preferred systems utilizing aluminum and its alloys. Additionally, copper has a higher resistance to electromigration. Furthermore, copper and its alloys enjoy a considerable cost advantage over a number of other conductive materials, notably silver and gold. Also, in contrast to aluminum and refractory-type metals, copper and its alloys can be readily deposited at low temperatures formed by well-known (wet) plating techniques, such as electroless and electroplating techniques, at deposition rates fully compatible with requirements of manufacturing throughput.

The more relevant technical developments in the patent literature can be gleaned by considering the following patents.

U.S. Pat. No. 6,633,085—Besser, et al.—shows a method of selectively alloying interconnect regions by ion implantation. A metal interconnect structure and method of making the same implants ions of an alloy elements into a copper line through a via. Then ion implantation of the alloy elements in the copper line through the via provides improved electromigration properties at the copper line at a critical electromigration failure site, without attempting to provide alloy elements throughout the entire copper line.

U.S. Pat. No. 6,500,749—Liu, et al.—Method to improve copper via electromigration (EM) resistance—Ions are implanted through the via pattern hole into the metal via portion, and any portion of the metal interconnect structure above the metal via portion. Whereby the metals have improved electromigration resistance.

U.S. Pat. No. 6,713,875—Farrar—Barrier layer associated with a conductor layer in damascene structures.

US 20030160330 A1—McTeer, Allen—Copper interconnect for an integrated circuit and method for its fabrication—A small dose of titanium is implanted in the copper surface. The implanted titanium layer suppresses the copper oxide growth in the copper bond pad by controlling the concentration of vacancies available to the copper ion transport.

U.S. Pat. No. 6,426,289—Farrar—shows a method of fabricating a barrier layer associated with a conductor layer in damascene structures.

U.S. Pat. No. 6,117,770—Pramanick, et al. shows a method for implanting semiconductor conductive layers.

U.S. Pat. No. 6,228,759—Wang, et al. shows a method of forming an alloy precipitate to surround interconnect to minimize electromigration. An alloy precipitate is formed to surround a conductive fill within an interconnect opening, including especially a top surface of the conductive fill. The alloy precipitate at the top surface and at the grain boundary of the conductive fill prevents drift of the conductive material along the top surface and along the grain boundary of the conductive fill and into the insulating layer surrounding the interconnect opening.

US 20040005773 A1—Lopatin,; et al.—Method of using ternary copper alloy to obtain a low resistance and large grain size interconnect—A method of fabricating an integrated circuit includes forming a barrier layer along lateral side walls and a bottom of a via aperture and providing a ternary copper alloy via material in the via aperture to form a via.

SUMMARY OF THE INVENTION

Example embodiments of the present invention provide structures and methods for forming an interconnect structure with a doped region in a top portion of a lower interconnect.

An example embodiment is a method to fabricate a metal interconnect structure having improved electromigration resistance, comprising the steps of:

providing a semiconductor structure having an exposed interconnect therein;

implanting alloying elements into the interconnect to form a first implanted region in the interconnect;

annealing the interconnect and the first implanted region to form a first doped region in a top portion of the interconnect; the first doped region having grain boundaries that are at least partially blocked.

An example embodiment is an interconnect structure comprise the following:

a dielectric layer over a semiconductor structure;

a hard mask layer over said dielectric layer;

an interconnect opening in said hard mask layer and said dielectric layer;

a barrier layer over said hard mask layer said dielectric layer in said interconnect opening;

an interconnect filling said interconnect opening comprised of copper;

a first doped region in a top portion of said interconnect.

This summary incorporates by reference the substance of the claims of this patent as allowed.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A-2 shows a cross sectional view of an first example embodiment of an interconnect structure.

FIG. 2A-1 shows a cross sectional view of a second example embodiment of an interconnect structure.

FIG. 2A-2 shows a cross sectional view of a second example embodiment of an interconnect structure.

DETAILED DESCRIPTION OF THE EXAMPLE EMBODIMENTS

Example embodiments of the present invention will be described in detail with reference to the accompanying drawings. The example embodiments of the present invention provides a structure and method of forming an interconnect having a doped region near the surface. The doped region had alloying elements that block at least some of the grain boundaries and reduce stress and electro migration.

Two example method and structure embodiments are described below. In the first embodiment, the barrier layer is not removed by chemical-mechanical polish (CMP) before the implantation of the alloying element. The barrier layer acts as an implant block to prevent the alloying elements from being implanted into the dielectric layer.

In the second embodiment, the barrier layer is removed by chemical-mechanical polish (CMP) before the implantation of the alloying element. A hard mask layer that underlies the barrier layer acts as an implant block to prevent the alloying elements from being implanted into the dielectric layer.

I. First Example Embodiment

FIGS. 1A-1, 1A-2, and 1B to 1E show a first example embodiment for a method of forming an interconnect. In the first embodiment, the barrier layer is not removed by chemical-mechanical polish (CMP) before the implantation of the alloying element. The barrier layer acts as an implant block to prevent the alloying elements from being implanted into the dielectric layer.

Figures 1, 1A:
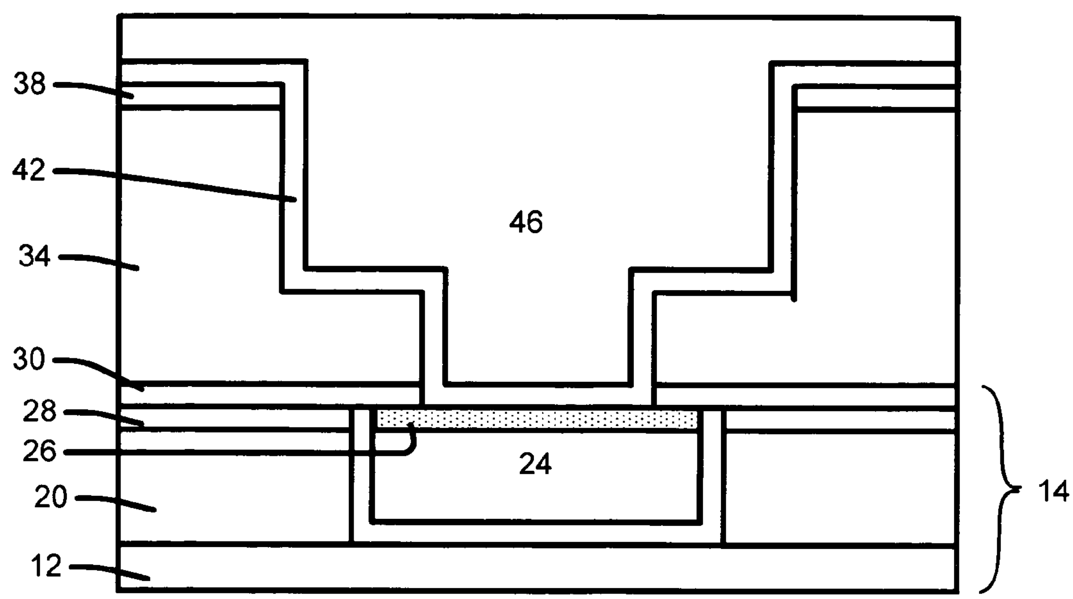
FIG. 1A-1 shows a cross sectional view of an first example embodiment of an interconnect structure.

Referring to FIG. 1A-1, we provide a semiconductor structure 14 having an exposed lower interconnect 24 and an inter metal dielectric layer 20. The term "structure surface" is meant to include the upper most exposed layers over a semiconductor wafer, such as a silicon surface, an insulating layer and/or conductive lines.

The lower interconnect 24 is preferably comprised of copper. The lower interconnect preferably has a top doped region 26. The top doped region is preferably formed by an embodiment of the invention. The lower interconnect is shown for an example and the style and composition of the lower interconnect can be any feasible interconnect.

The top doped region 26 is preferably doped with alloying element such as B, P N or C with a concentration less than 1% and more preferably between 0.1 and 1 atomic %. The alloying elements are preferably non-metallic. The top doped region 26 has at least some grain boundaries stuffed with the alloying element. See below for further description. At least some of the grain boundaries of the top doped region 26 are blocked by solutes and precipitates or the alloying elements.

The top doped region preferably has a depth between 400 and 1300 Å.

The inter metal dielectric layer is preferably comprised of low K 16 materials such an OSG material, examples of which can include BLACK DIAMOND silicon oxide-based CVD low-k film available from Applied Materials, Inc.; CORAL low-k dielectric film available from Novellus Systems Inc.; and SiLK dielectric material available from Dow Chemical Co. Other examples of low-k materials include; BLACK DIAMOND 2 insulator material available from Applied Materials, Inc.; or p-SiLK dielectric material available from Dow Chemical Co. (low K is dielectric constant K<3).

The semiconductor structure further comprises a hard mask 28 on the inter metal dielectric layer 20. The hard mask can be comprised of SiO2, SiN, or SiC based materials.

Next, we form a lower cap layer 30 over the lower interconnect 24 and the inter metal dielectric layer 20. The cap layer is preferably comprised of SiC based, or SiN based materials or combinations thereof.

Subsequently, we form a dielectric layer 34 over the lower cap layer 30.

The dielectric layer 34 is preferably comprised of low K materials such as described above (low K is K<3).

A hard mask layer 38 is formed over the dielectric layer 34.

We then forming an interconnect opening in the hard mask layer 38 and the dielectric layer 34.

The interconnect opening preferably has a dual damascene shape comprising a top line opening and a bottom via plug opening.

We form a barrier layer 42 over the hard mask layer 38 the dielectric layer 34 in the interconnect opening. The barrier layer can also act as an implant mask for a subsequent doping implant.

The barrier layer 42 is preferably comprised of Ru, Ru oxide, W, TiSiN, Ta, TaN or a bi-layer of Ta and TaN. The barrier layer preferably has a thickness between 100 and 500 Å. The barrier layer preferably acts an implant mask. The barrier layer preferably has thickness between 100 and 300 Å.

A barrier layer comprised of a layer of Ta and a layer of TaN (Ta/TaN) preferably has a thickness between 100 and 300 Å and more preferably about 200 Å.

The interconnect can be comprised of a conductive metal, such as Au, Al, Cu, Cu alloys, Ag, and W. Preferably the interconnect is comprised of Cu formed using a damascene process.

We form a copper layer filling the interconnect opening and covering the barrier layer 42. The copper layer can be Cu or a copper alloy such as CuAl. The copper layer is preferably made using a ECP process and the copper is preferably substantially pure.

Figures 1, 1A, 2:
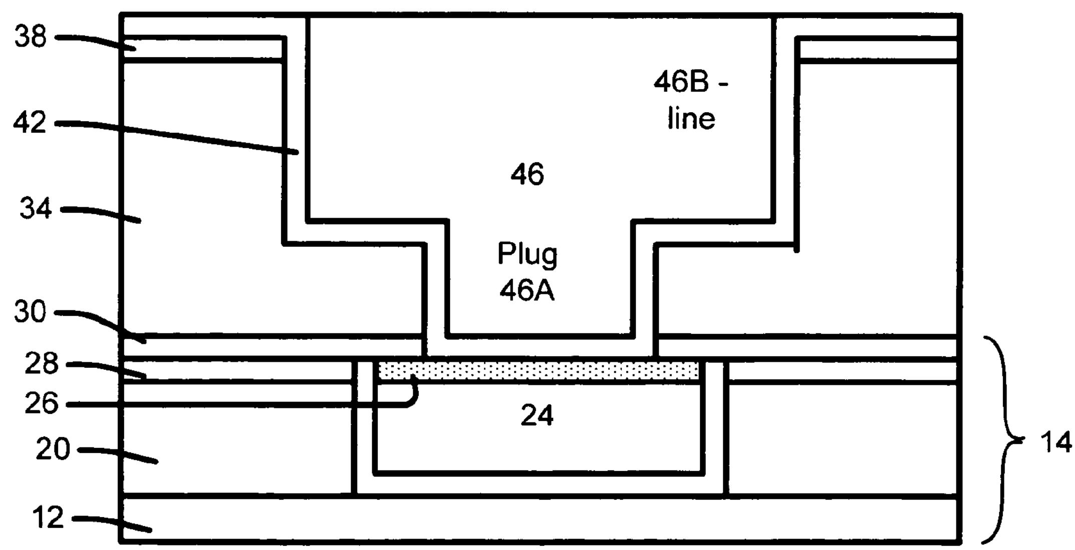

Referring to FIG. 1A-2, we planarize the copper layer to a level about even with the barrier layer 42 to form an interconnect 46 preferably without removing significant portions of the barrier layer.

Preferably, CMP process paused after removing the Metal 46 over the Barrier layer and before barrier (Ta/TaN) was planarized and removed. In order to secure 1-step CMP uniformity, there is a new technology called E-CMP which can also be used here to remove Cu only (remain barrier layer e.g., Ta/TaN).

The dual damascene interconnect 46 is preferably comprised of a via plug 46A and a line 46B.

Figure 1B:
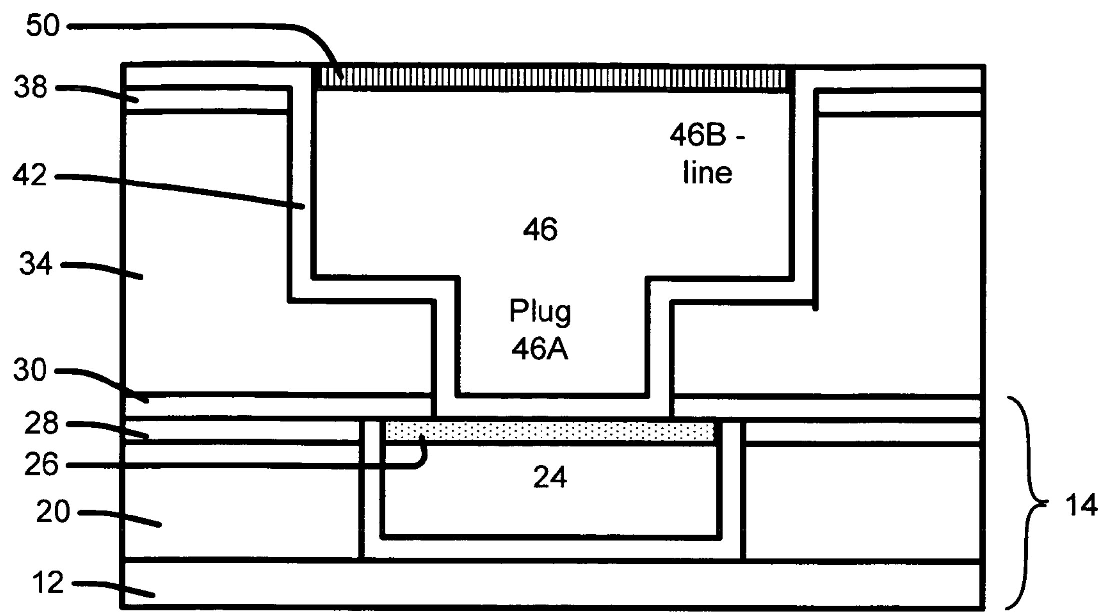
FIGS. 1B to E1 show a cross sectional views of an first example embodiment of an interconnect structure.

Referring to FIG. 1B, we place (e.g., ion implant) alloying elements into the interconnect 46 and the barrier layer 42 to form a first implanted region 50. Preferably, we use a plasma immersion ion implantation process.

Preferably the entire exposed top surface of the interconnect 46 is implanted.

In an example plasma immersion ion implantation process, we implant, B, P, N, Si or C atoms, at an energy between 10 to 100 keV and more preferably at a bit high energy 40 to 100 keV. The dose is preferably between $1\times1E15^{15}$ and $1\times1E18^{18}$ atoms/sq-cm.

The alloying elements are preferably comprised of a material comprising B, P, N, Si or C. Preferably the alloying elements are non-metallic so there is less concern for a "shorting" failure.

Since barrier (e.g., Ta/TaN) are materials with dense-structure and heavy atoms, it was expected that dopants will not penetrate further through this barrier layer 42. Therefore the underneath IMD layers will not be affected.

Figure 1C:
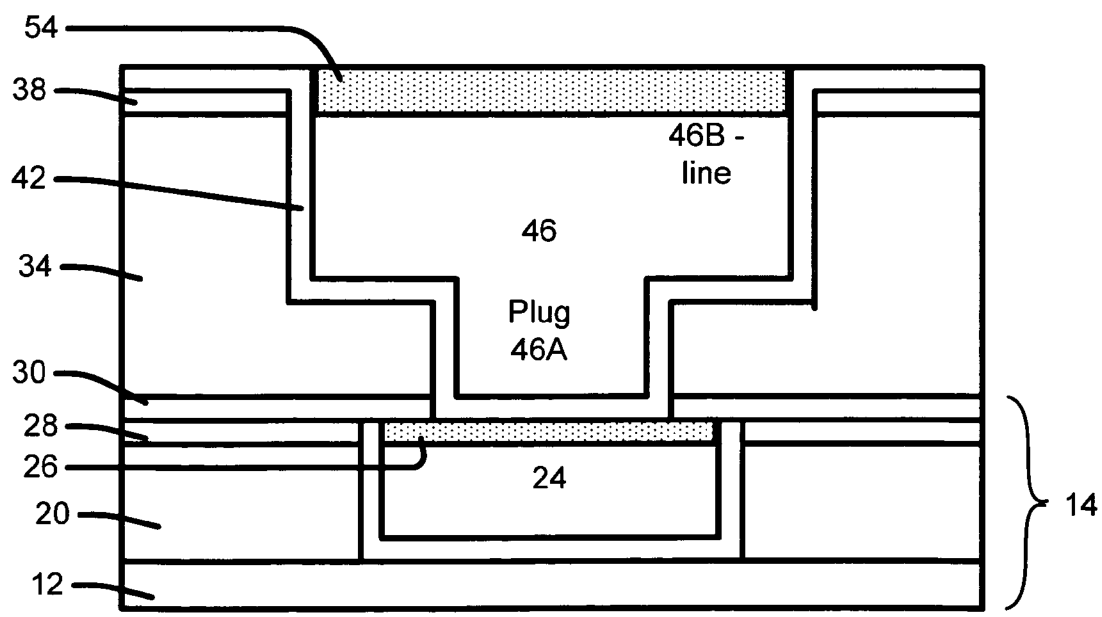

Referring to FIG. 1C, we anneal the interconnect and the first implanted region 50 to form a first doped region 54 in a top portion of the interconnect. The first doped region has grain boundaries that are occupied by the alloying elements.

The anneal can be performed at a temperature between 200 to 400° C., and more preferably between 250 to 300° C. The anneal is preferably performed for a time between 10 to 30 minutes and is preferably performed in a gas environment of $N_2$ or $N_2/H_2$.

The anneal is preferably performed after the doping implant for each metal layer although it is possible to perform one anneal after all metal doping/metal layer are formed.

The first doped region 54 (after anneal) has an alloying element concentration between about 0.1 and 1.00 atomic % and more preferably between 0.1 and 0.5 atomic %.

The first doped region has a depth between 400 and 1300 Å and more preferably between 700 and 800 Å.

In the first embodiment, since we preferably have about 300 angstroms Ta barrier before doping, the penetration depth should be thicker than that in the second embodiment.

The portion of the interconnect 46 below the first doped region 54 is substantially free of the alloy elements.

The interconnect was implanted with B, P, N, Si, C or other suitable dopants, and annealed at certain temperature to drive these dopants to diffuse into the Cu lattice.

Figure 3:
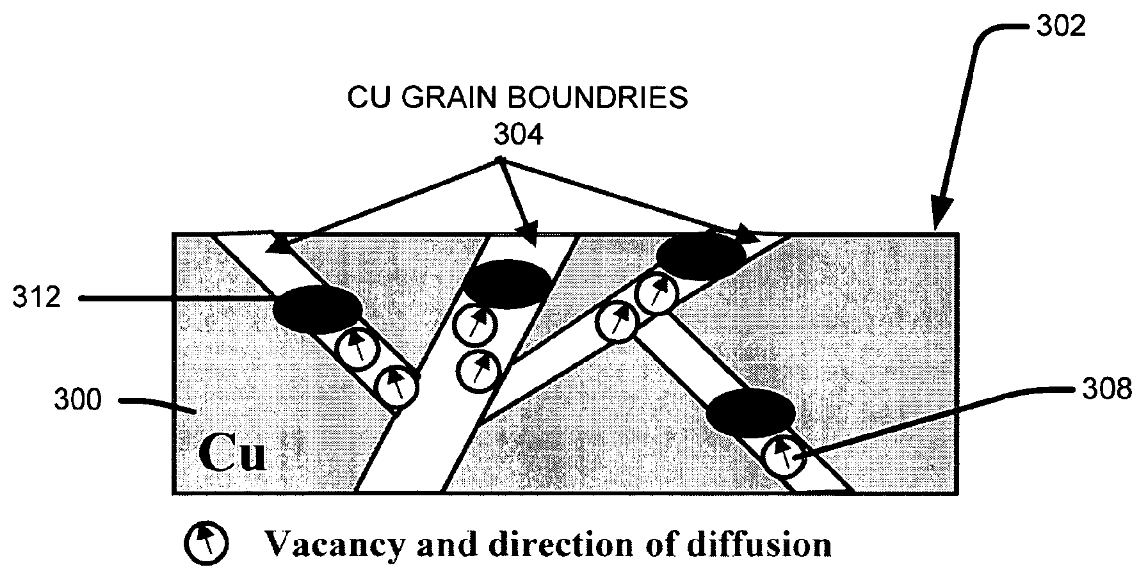
FIG. 3 shows a cross sectional view of the top surface of doped region of the interconnect after anneal.

As shown in FIG. 3, since these dopants are normally preferentially located in the grain boundaries of Cu, it is expected that the ideal diffusion channels for vacancies such as grain boundaries and surface will be blocked by B, P or other suitable dopants. Therefore the process of accumulation of vacancies can be retarded. Take the normal big grain size of Cu (after anneal) into consideration, the volume percentage of grain boundaries in the dual damascene Cu lines will not be high. Therefore the required concentration of dopants in the Cu to block the diffusion of vacancies may not need to be high too (<<1%).

FIG. 3 shows a cross sectional view of the top surface of doped region 300 of the interconnect after anneal. FIG. 3 shows the solutes or precipitates 312 of the alloying elements in the grain boundaries of the Cu grains. The alloying elements block the diffusion of vacancies 308 and thereby reduce stress and electro migration problems.

Figure 1D:
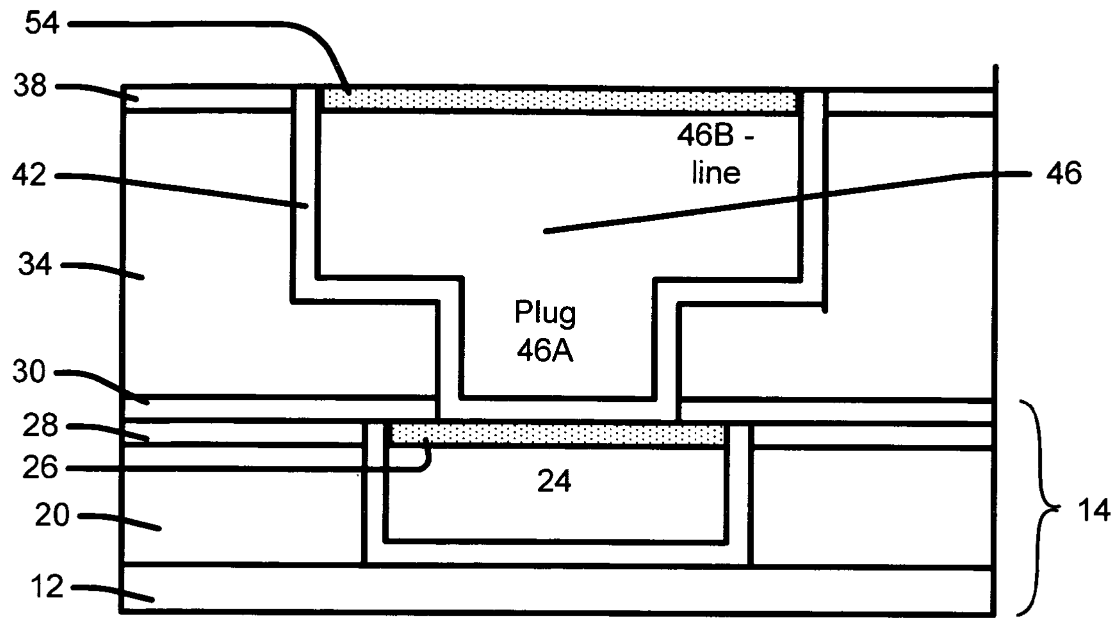
Figure 1E:
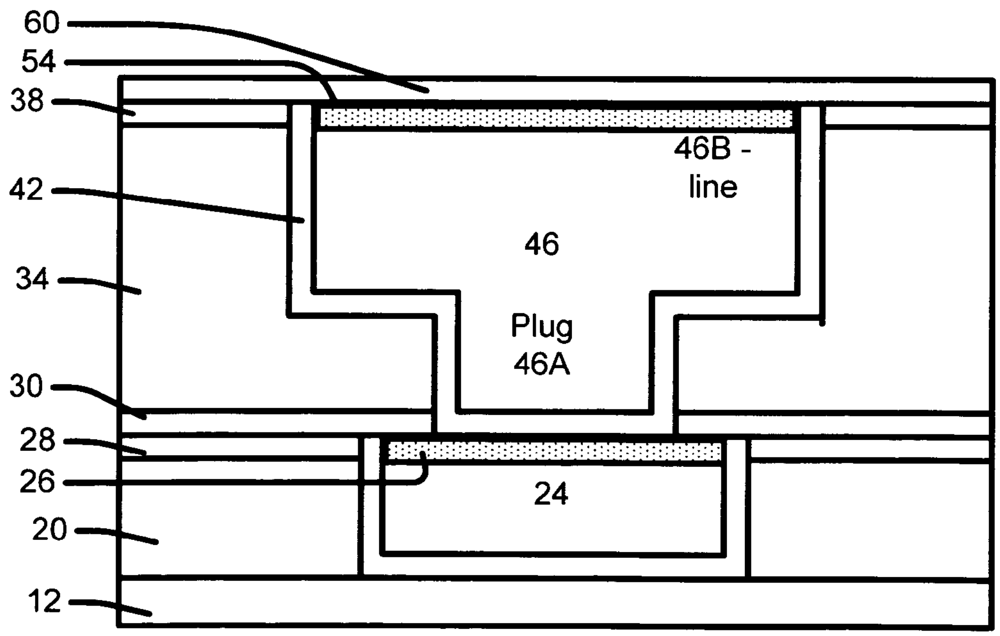

Referring to FIG. 1D, we planarize the barrier layer to remove the barrier layer over the top surface of the inter metal dielectric layer. Preferably the CMP does not remove significant portions of the interconnect 46.

The final stage of chemical-mechanical polish will remove the barrier (which can be 100 to 300 angstroms thick). A portion of the Cu line may also be polished away during this stage. Preferably, the doping region is thick enough to compensate for the portion lost during the CMP process. However, the doped region is not too thick to increase the Cu resistance too much.

After the CMP, the first doped region preferably has a depth between 100 and 1000 angstroms anneal and more preferably a depth between 400 and 500 angstroms.

We then form a capping layer 60 over the interconnect 46.

Subsequently, another inter metal dielectric layer and overlying interconnect can be formed contacting the top surface of the interconnect.

II. Second Example Embodiment

Figures 1, 2A:
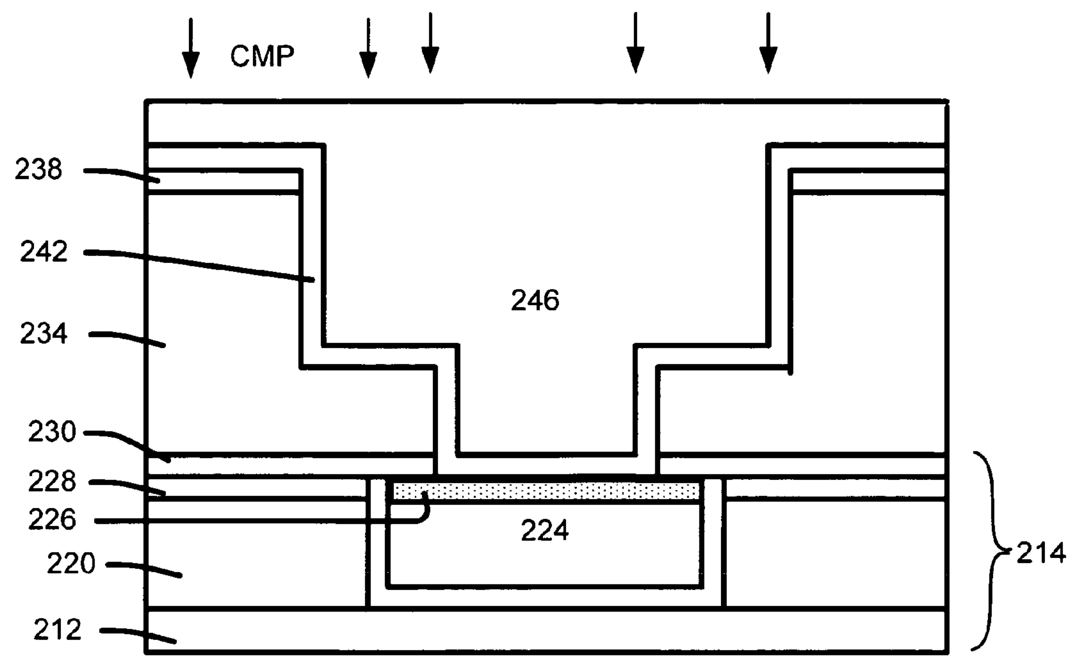
Figures 2, 2A:
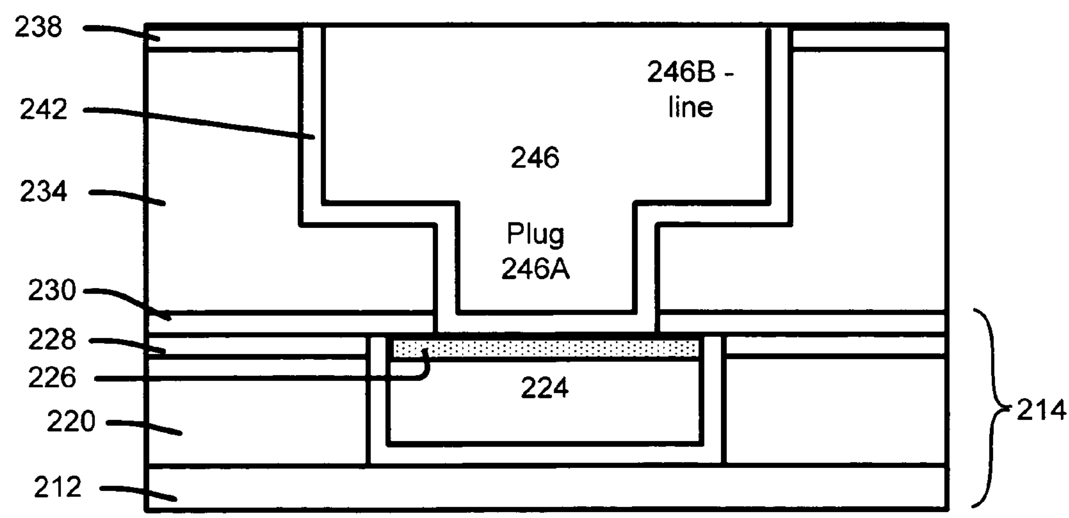
Figure 2B:
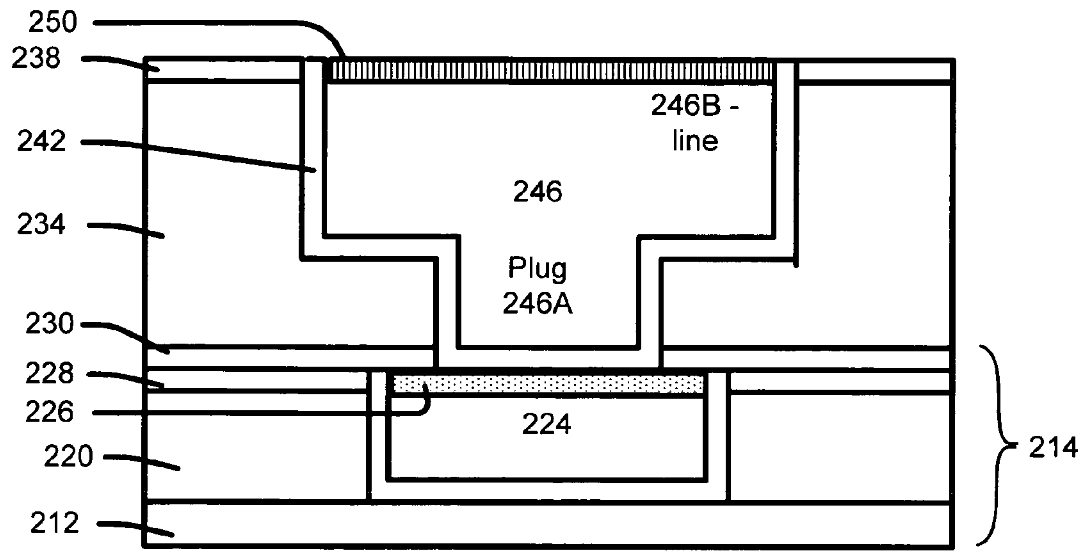
FIGS. 2B to 2D show a cross sectional views of a second example embodiment of an interconnect structure.
Figure 2C:
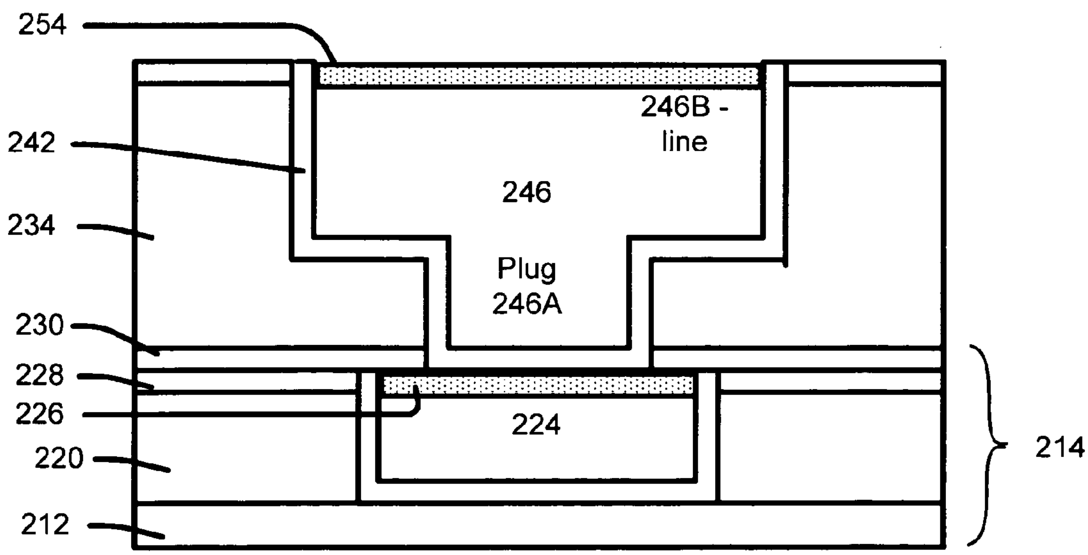
Figure 2D:
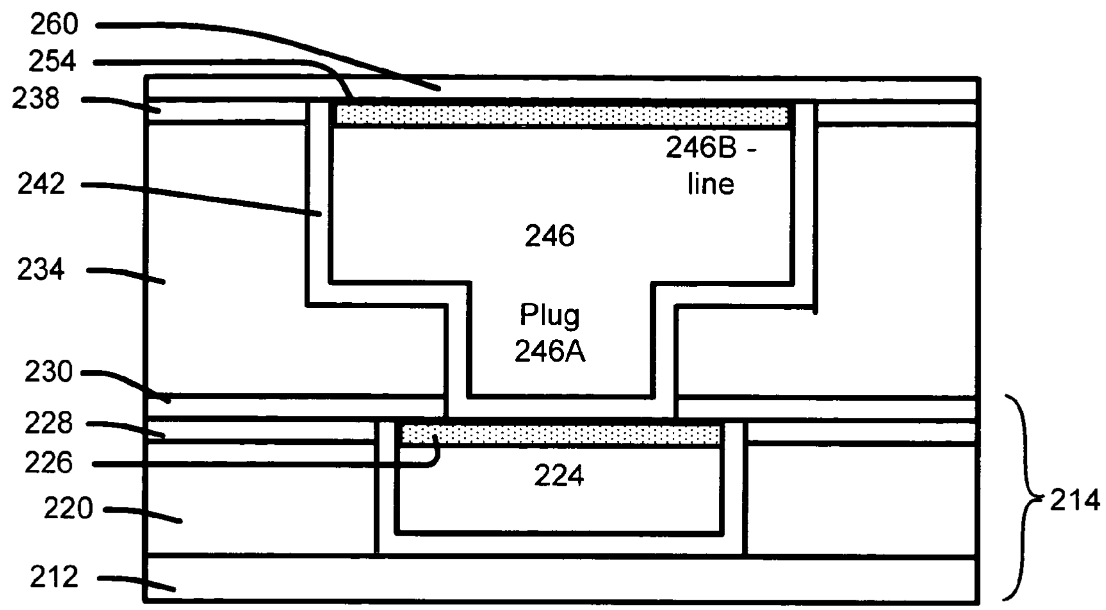

FIGS. 2A-1 to 2D show a second example embodiment for a structure and a method of forming an interconnect. In the second embodiment, the barrier layer is removed by chemical-mechanical polish (CMP) before the implantation of the alloying element. A hard mask layer that underlies the barrier layer acts as an implant block to prevent the alloying elements from being implanted into the dielectric layer. Parameters for the second embodiment are similar to the first embodiment unless otherwise specified.

Referring to FIG. 2A-1, we provide a semiconductor structure 214 having an exposed lower interconnect 224 and an inter metal dielectric layer 220.

The lower interconnect 224 can be comprised of copper. The lower interconnect preferably has a top doped region 226.

The top doped region 226 is doped with alloying element such as B, P, N, Si, or C with preferably concentration less than 1%. The top doped region 226 having at least some grain boundaries stuffed with the alloying element.

At least some of the grain boundaries of the top doped region 226 are blocked by solutes and precipitates or the alloying elements.

The top doped region can have a depth between 400 and 1300 Å.

The inter metal dielectric layer is comprised of low K materials such as Coral™, Black diamond™, Silk™ (low K is K<3).

The semiconductor structure further comprises a hard mask 228 on the inter metal dielectric layer 220. The hard mask can be comprised of SiO2, SiN, or SiC based materials.

We form a lower cap layer 230 over the lower interconnect 224 and the inter metal dielectric layer 220.

We form a dielectric layer 234 over the lower cap layer 230.

The dielectric layer 234 is preferably comprised of low K materials such as Coral™, Black diamond™, Silk™ (low K is K<3).

We form a hard mask layer 238 over the dielectric layer 234.

We form an interconnect opening in the hard mask layer 238 and on the dielectric layer 234.

The interconnect opening preferably has a dual damascene shape comprising a top line opening and a bottom via plug opening.

We form a barrier layer 242 over the hard mask layer 238 and the dielectric layer 234 in the interconnect opening.

The barrier layer 242 is preferably comprised of Ru, Ru oxide, W, TiSiN, Ta, TaN or a bi-layer of Ta and TaN. The barrier layer preferably has a thickness between 100 and 500 Å.

Then we form copper layer filling the interconnect opening and covering the barrier layer 242.

Referring to FIG. 2A-2, we planarize the copper layer and the barrier layer to a level about even with the top of hard mask layer 238. This forms an interconnect 246 and removes the barrier layer 242 over the hard mask layer 238. The CMP can remove a portion of the hard mask.

Preferably the CMP removed substantially all the barrier layer (e.g., Ta/TaN) and stopped on the hard mask. The interconnect 246 top surface is exposed.

The interconnect 246 is preferably comprised of a via plug 246A and a line 246B.

As shown in FIG. 2B, we ion implant alloying elements into the interconnect 226 and the barrier layer 242 to form a first implanted region 250.

The implant process (e.g., energy, dose, ions, etc) can be performed as described above in the 1$^{st}$ embodiment.

Preferably the entire exposed top surface of the interconnect 246 is implanted.

It can be seen from the above process that the dopants will also hit on the areas covered by hard mask depend on the CMP process. It was expected that the dopants will stopped by the hard mask layers and will minimize its effect to the IMD layers.

Referring to FIG. 2C, we anneal the interconnect and the first implanted region 250 to form a first doped region 254 in a top portion of the interconnect. The first doped region has grain boundaries that are blocked by the alloying elements. The anneal can be performed as described in the 1$^{st}$ embodiment.

The first doped region 254 has a alloying element concentration between about 0.1% and 1.00 atomic % and more preferably between 0.1 and 0.5 atomic %.

After the anneal, the first doped region has a depth between 100 and 1000 angstroms after anneal and more preferably a depth between 400 and 500 angstroms. Preferably the depth is about 7 to 12% of the line thickness or preferably about 10% of the line thickness.

The portion of the interconnect 246 below the first doped region 254 is preferably substantially free of the alloy elements from the first doped region 254.

FIG. 3 shows a cross sectional view of the top surface 302 of doped region 300 of the Cu interconnect 300 after anneal. FIG. 3 shows the solutes or precipitates 312 of the alloying elements in the grain boundaries 304 of the Cu grains. The alloying elements (such as solutes or precipitates 312) block the diffusion of vacancies 308 and thereby reduce stress and electro migration problems.

As shown in FIG. 2D, we form a capping layer 260 over the interconnect 246. Preferably, no CMP process is used between the implant step and the formation of the capping layer 260.

Subsequently, another inter metal dielectric layer and overlying interconnect can be formed contacting the top surface of the interconnect.

The figures are not to scale or proportion.

The above description and illustrations should not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method to fabricate an interconnect structure comprising:

providing a substrate prepared with an intermetal dielectric having an interconnect with an interconnect top surface which is coplanar with an intermetal dielectric top surface of the intermetal dielectric;

forming a top doped region comprising non-metallic dopants, wherein forming the top doped region comprises providing the non-metallic dopants having a first dopant concentration in a top portion of the interconnect, and annealing the substrate, wherein annealing causes the non-metallic dopants in the top portion of the interconnect to block at least some grain boundaries in the top doped region, wherein a lower portion of the interconnect below the top doped region is substantially free of the non-metallic dopants as compared to the top doped region.

2. The method of claim 1 wherein:
the interconnect comprises copper; and
the doped region spans across the entire interconnect top surface.

3. The method of claim 1 wherein:
the interconnect comprises copper; and
the doped region covers the entire interconnect top surface, the first dopant concentration comprises less than about 1 atomic %.

4. The method of claim 1 wherein:
the interconnect comprises copper; and
the non-metallic dopants are selected from N, B, P, Si and C or combinations thereof; and
the first dopant concentration comprises less than about 1 atomic %.

5. The method of claim 1 wherein the interconnect is formed in a dual damascene opening in the intermetal dielectric, the dual damascene opening comprising a top line opening and a bottom via plug opening.

6. The method of claim 1 wherein:
the interconnect comprises copper; and
the first dopant concentration comprises about 0.1 atomic % to 1.0 atomic %.

7. The method of claim 1 wherein:
the interconnect comprises copper;
the interconnect is formed in a dual damascene opening in the intermetal dielectric, the dual damascene opening comprising a top line opening for an interconnect line and a bottom via plug opening for an interconnect plug; and
the doped region has a depth of about 7 to 12% a height of the interconnect line.

8. The method of claim 1 wherein the doped region extends across the entire interconnect top surface.

9. The method of claim 1 wherein the doped region has a final depth between about 100 and 1000 Å.

10. A method of forming a device comprising:
providing a substrate prepared with an intermetal dielectric with an interconnect, wherein an interconnect top surface of the interconnect is coplanar with the intermetal dielectric top surface of the intermetal dielectric; and
forming a top doped region at a top portion of the interconnect, the top doped region comprises non-metallic dopants having a first dopant concentration, the non-metallic dopants block at least some grain boundaries in the top doped region, wherein a lower portion of the interconnect below the top doped region is substantially free of non-metallic dopants as compared with the top doped region.

11. The method of claim 10 wherein an interconnect barrier layer lines the intermetal dielectric top surface and interconnect, wherein the interconnect top surface of the interconnect is coplanar with a barrier top surface of the barrier layer.

12. The method of claim 11 wherein portions of the barrier layer lining the intermetal dielectric top surface are removed after forming the doped region.

13. The method of claim 11 wherein portions of the barrier layer lining the intermetal dielectric top surface are removed prior to forming the doped region.

14. The method of claim 10 wherein:
a hard mask is provided on the intermetal dielectric top surface, the hard mask is used to pattern a trench in the intermetal dielectric for the interconnect; and
an interconnect barrier layer lining the trench and a hard mask top surface of the hard mask, wherein the interconnect top surface is coplanar with a barrier top surface of the barrier layer.

15. The method of claim 14 wherein portions of the barrier layer lining the hard mask top surface of the hard mask are removed after forming the doped region.

16. The method of claim 14 wherein portions of the barrier layer lining the hard mask top surface of the hard mask are removed prior to forming the doped region.

17. The method of claim 10 further comprises an anneal to diffuse the dopants of the doped region to block the grain boundaries.

18. The method of claim 10 wherein the non-metallic dopants comprise B, P, N, Si, C or a combination thereof.

19. The method of claim 10 wherein the first dopant concentration comprises about 0.1-1.0 atomic percent.

20. The method of claim 10 wherein the interconnect comprises copper.

21. A method of forming an interconnect comprising:
providing a substrate prepared with an intermetal dielectric having a trench therein corresponding to an interconnect;
forming a conductive layer on the substrate, the conductive layer covering the intermetal dielectric and filling the trench;
planarizing the substrate to remove excess conductive layer to form the interconnect in the trench, wherein an interconnect top surface of the interconnect is coplanar with an interconnect dielectric top surface of the interconnect dielectric; and
forming a top doped region at a top portion of the interconnect, the top doped region comprising non-metallic dopants having a first dopant concentration, the non-metallic dopants block at least some grain boundaries of the interconnect in the top doped region, wherein a lower portion of the interconnect below the top doped region is substantially free of non-metallic dopants as compared with the top doped region.

22. A method of forming an interconnect in a semiconductor device comprising:
providing a substrate prepared with an intermetal dielectric having a trench therein corresponding to an interconnect;
forming a conductive layer on the substrate, the conductive layer covering the intermetal dielectric and filling the trench;
planarizing the substrate to remove excess conductive layer to form the interconnect in the trench, wherein an interconnect top surface of the interconnect is coplanar with an interconnect dielectric top surface of the interconnect dielectric; and
forming a top doped region comprising non-metallic dopants, wherein forming the top doped region comprises
providing the non-metallic dopants having a first dopant concentration in a top portion of the interconnect, and
annealing the substrate, wherein annealing causes the non-metallic dopants in the top portion of the interconnect to block at least some grain boundaries in the top doped region, wherein a lower portion of the interconnect below the top doped region is substantially free of the non-metallic dopants as compared to the top doped region.

* * * * *